US011395419B2

(12) United States Patent
Chen et al.

(10) Patent No.: US 11,395,419 B2
(45) Date of Patent: Jul. 19, 2022

(54) STEPPED VENTING PANEL

(71) Applicant: Quanta Computer Inc., Taoyuan (TW)

(72) Inventors: Chao-Jung Chen, Taoyuan (TW);
Yu-Nien Huang, Taoyuan (TW);
Herman Tan, Taoyuan (TW)

(73) Assignee: QUANTA COMPUTER INC.,
Taoyuan (TW)

( * ) Notice: Subject to any disclaimer, the term of this patent is extended or adjusted under 35 U.S.C. 154(b) by 3 days.

(21) Appl. No.: 17/158,775

(22) Filed: Jan. 26, 2021

(65) Prior Publication Data

US 2022/0124919 A1 Apr. 21, 2022

Related U.S. Application Data

(60) Provisional application No. 63/094,129, filed on Oct. 20, 2020.

(51) Int. Cl.
*H05K 5/02* (2006.01)
*H05K 7/14* (2006.01)

(52) U.S. Cl.
CPC ......... *H05K 5/0213* (2013.01); *H05K 7/1488* (2013.01)

(58) Field of Classification Search
CPC ......... H05K 5/213; H05K 5/0217; H05K 7/14
See application file for complete search history.

(56) References Cited

U.S. PATENT DOCUMENTS

| 2007/0201181 | A1* | 8/2007 | Dubrule | G06F 1/20 |
| | | | | 361/297 |
| 2012/0026687 | A1* | 2/2012 | Wen | H05K 7/20409 |
| | | | | 361/692 |
| 2012/0035940 | A1* | 2/2012 | Jeong | G10L 19/008 |
| | | | | 704/500 |
| 2021/0337692 | A1* | 10/2021 | Wang | H05K 7/1487 |
| 2022/0078532 | A1* | 3/2022 | Shearman | H05K 7/023 |

FOREIGN PATENT DOCUMENTS

CN 113067749 A * 7/2021

* cited by examiner

*Primary Examiner* — Daniel J Rohrhoff
(74) *Attorney, Agent, or Firm* — Nixon Peabody LLP

(57) ABSTRACT

A system chassis insertable in a rack is disclosed. The system chassis includes a first end panel. The first end panel includes a first base surface, a first component slot, a first plurality of venting apertures, and a first protrusion. The first base surface has a first portion and a second portion. The first component slot is formed on the first portion of the first base surface. The first component slot is configured to receive a first system component. The first plurality of venting apertures is formed on the first portion of the first base surface and surrounding the first component slot. The first protrusion extends from the second portion of the first base surface. The first protrusion includes a second plurality of venting apertures and a second component slot. The second component slot configured to receive a second system component.

21 Claims, 5 Drawing Sheets

STEPPED VENTING PANEL

CROSS-REFERENCE TO RELATED APPLICATIONS

This application claims priority under 35 U.S.C. § 119 to U.S. Provisional Application No. 63/094,129, entitled "Enhanced Venting Design On System Front/Rear Panel," and filed on Oct. 20, 2020. The contents of that application are hereby incorporated by reference in their entirety.

TECHNICAL FIELD

This disclosure relates generally to server system venting, and more particularly, to venting panels on server systems.

BACKGROUND

Common server systems and computer storage systems support input/output cards ("I/O cards"). Typically, the I/O cards are located at either the front panel or the rear panel of their system chassis, as illustrated in FIGS. 1-2.

Referring generally to FIGS. 1-2, a conventional server system 10 includes a server chassis 12, which has a front panel 14, a rear panel 16, and a top panel 18. The front panel 14 includes six slots 20a, 20b, 20c, 20d, 20e, 20f configured to receive six corresponding cards (e.g., I/O cards). The rear panel 16 includes four slots 22a, 22b, 22c, 22d configured to receive four corresponding cards (e.g., I/O cards), which are located between two power supply units ("PSUs") 30 and 32.

The slots, when empty, may function as venting slots for the conventional server system 10. However, the conventional server system 10 may be required to support all six corresponding cards in the six slots 20a, 20b, 20c, 20d, 20e, 20f of the front panel 14, and all four corresponding cards in the four slots 22a, 22b, 22c, 22d of the rear panel 16. Once installed with cards, the slots 20a-20f and 22a-22d are no longer available as venting slots for the conventional server system 10. Thus, as best shown in FIG. 1, the front panel 14 may include a number of openings 40 to facilitate ventilation. As best shown in FIG. 2, the rear panel 16 may also include a number of openings 42 to facilitate ventilation. In both FIGS. 1-2, the conventional server system 10 has little and/or insufficient venting when the front panel 14 and the rear panel 16 are fully populated with I/O cards.

A server system with little or insufficient venting has poor thermal efficiency and/or will need to utilize higher system fan power. Higher fan power requires that the system fan must run at a higher speed to maintain adequate airflow for the system. Existing attempts to increase airflow in a crowded server system includes adding openings on the top panel, bottom panel, or side panels of the server chassis. For example, FIG. 3 depicts the top panel 18 of the server chassis 12 of the conventional server system 10, where additional openings 44 are positioned on the top panel 18. However, once the conventional server system 10 is inserted into a server rack, any openings on the top panel 18, the bottom panel, and the side panels may be blocked by the server rack itself and/or adjacent server systems.

Thus, a need exists for a server system that has adequate venting, and will not be constrained when the server system is inserted in the server rack. The present disclosure is directed to solving these problems.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

According to some implementations of the present disclosure, a system chassis insertable in a rack is disclosed as follows. The system chassis includes a first end panel. The first end panel includes a first base surface, a first component slot, a first plurality of venting apertures, and a first protrusion. The first base surface has a first portion and a second portion. The first component slot is formed on the first portion of the first base surface. The first component slot is configured to receive a first system component. The first plurality of venting apertures is formed on the first portion of the first base surface and surrounding the first component slot. The first protrusion extends from the second portion of the first base surface. The first protrusion includes a second plurality of venting apertures and a second component slot. The second component slot configured to receive a second system component.

In some implementations, the first protrusion of the first end panel includes a first front surface parallel to the first base surface. The second component slot is formed on the first front surface of the first protrusion of the first end panel.

In some implementations, the first protrusion of the first end panel includes a first top surface perpendicular to the first front surface and perpendicular to the first base surface. The first end panel further includes a third plurality of venting apertures formed on the first top surface of the first protrusion of the first end panel.

In some implementations, the first protrusion of the first end panel includes a first top surface sloped from the first base surface to the first front surface. The first end panel further includes a third plurality of venting apertures formed on the first top surface of the first protrusion of the first end panel.

In some implementations, the first end panel further includes a third plurality of venting apertures formed on a first side surface of the first end panel. In some implementations, the first side surface of the first end panel is perpendicular to the first front surface and perpendicular to the first base surface. In some implementations, the first side surface of the first end panel is sloped from the first base surface to the first front surface of the first protrusion.

In some implementations, the first protrusion of the first end panel includes a first bottom surface perpendicular to the first front surface and perpendicular to the first base surface. The first end panel further includes a fourth plurality of venting apertures formed on the first bottom surface of the first end panel.

In some implementations, the first protrusion of the first end panel includes a first bottom surface sloped from the first base surface to the first front surface, and wherein the first end panel further includes a fourth plurality of venting apertures formed on the first bottom surface of the first end panel.

In some implementations, the first end panel further includes a second protrusion, which extends from the first front surface of the first protrusion. The second protrusion includes a third plurality of venting apertures and a third component slot. The third component slot is configured to receive a third system component. In some such implementations, the second protrusion of the first end panel includes a second front surface parallel to the first base surface. The third component slot is formed on the second front surface of the second protrusion of the first end panel.

In some implementations, the first end panel includes a second top surface (i) perpendicular to the second front surface of the second protrusion and (ii) perpendicular to the first base surface. The third plurality of venting apertures is formed on the second top surface of the first end panel.

In some implementations, the first end panel includes a second side surface perpendicular to the first base surface and perpendicular to the second front surface of the second protrusion. In some implementations, the second side surface of the first end panel is sloped from the first base surface to the second front surface of the second protrusion.

In some implementations, the system chassis further includes a second end panel opposite to the first end panel. The second end panel includes a second base surface, a third component slot, a third plurality of venting apertures, and a third protrusion. The second base surface has a first portion and a second portion. The third component slot is formed on the first portion of the second base surface. The third component slot is configured to receive a third system component. The third plurality of venting apertures is formed on the first portion of the second base surface and surrounding the third component slot. The third protrusion extends from the second portion of the second base surface. The third protrusion includes a fourth plurality of venting apertures and a fourth component slot. The fourth component slot is configured to receive a fourth system component.

In some implementations, the third protrusion of the second end panel includes a front surface parallel to the second base surface of the second end panel. The fourth component slot is formed on the front surface of the third protrusion of the second end panel.

In some implementations, the third protrusion of the second end panel includes a top surface (i) perpendicular to the front surface of the second end panel and (ii) perpendicular to the second base surface of the second end panel. The second end panel further includes a fifth plurality of venting apertures formed on the top surface of the third protrusion of the second end panel.

In some implementations, the second end panel further includes a fifth plurality of venting apertures formed on a side surface of the second end panel. The side surface of the second end panel is sloped from the second base surface of the second end panel to the front surface of the second end panel.

In some implementations, the second end panel further includes a fourth protrusion, which extends from the third protrusion. The fourth protrusion including a fifth plurality of venting apertures and a fifth component slot. The fifth component slot is configured to receive a fifth system component. In some such implementations, the fourth protrusion of the second end panel includes a front surface parallel to the second base surface of the second end panel. The fifth component slot is formed on the front surface of the fourth protrusion of the second end panel.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The foregoing and other advantages of the present disclosure will become apparent upon reading the following detailed description and upon reference to the drawings.

Figure 1:
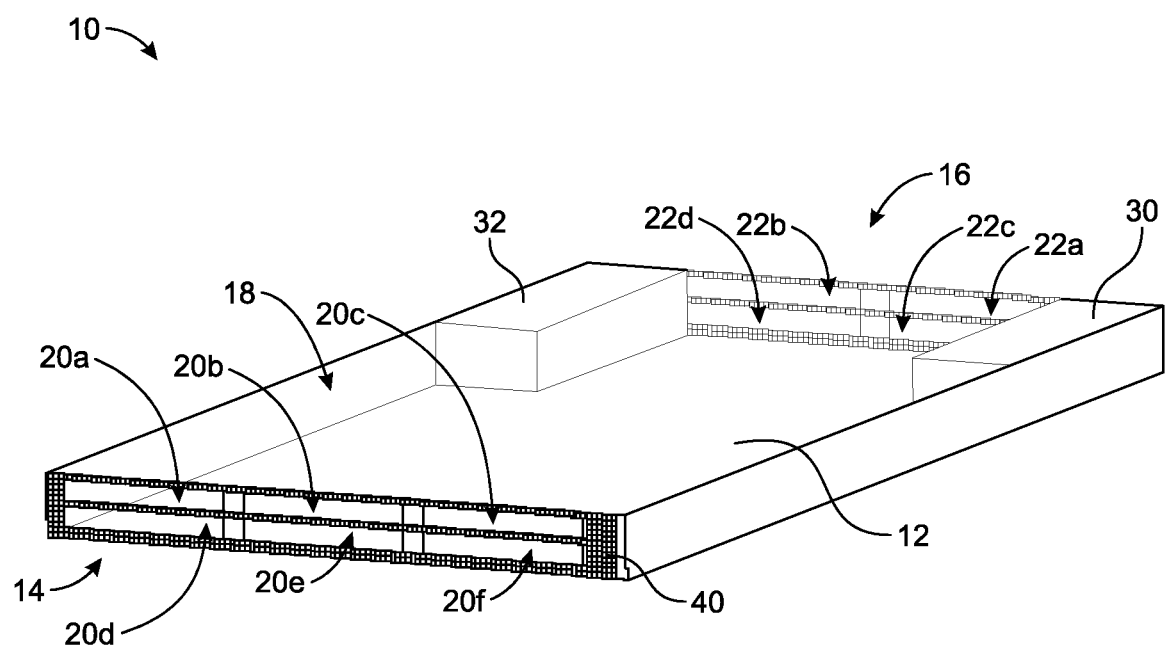
FIG. 1 depicts a perspective view of a front panel of a conventional server chassis, as known in the prior art.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure is described with reference to the attached figures, where like reference numerals are used throughout the figures to designate similar or equivalent elements. The figures are not drawn to scale and are provided merely to illustrate the instant disclosure. Several aspects of the disclosure are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure relates to a system chassis that has venting apertures on the front panel and/or the rear panel. The venting apertures may be formed on stepped surfaces of the front panel and/or the rear panel of the system chassis, such that the venting apertures allow additional airflow through the system, when the system chassis is inserted into a rack and/or placed adjacent to another system chassis. The stepped surfaces allow more venting apertures to be formed on the front panel and/or the rear panel, which can aid in (i)

reducing system pressure drop, (ii) reducing system fan power consumption, and (iii) enhancing cooling capacity in the system.

Figure 4:
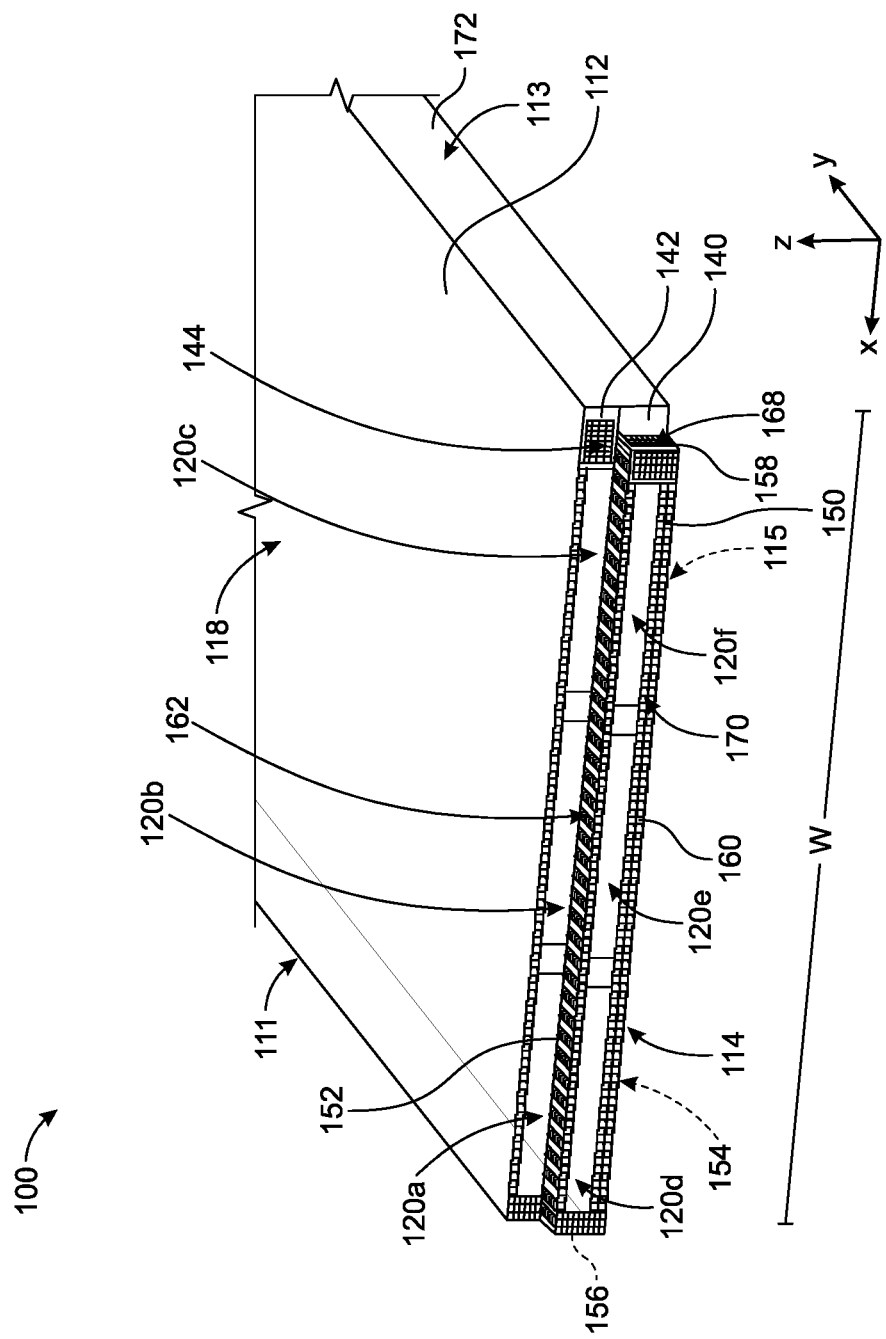
FIG. 4 depicts a perspective view of a stepped venting front panel of a server chassis, according to some implementations of the present disclosure.
Figure 5:
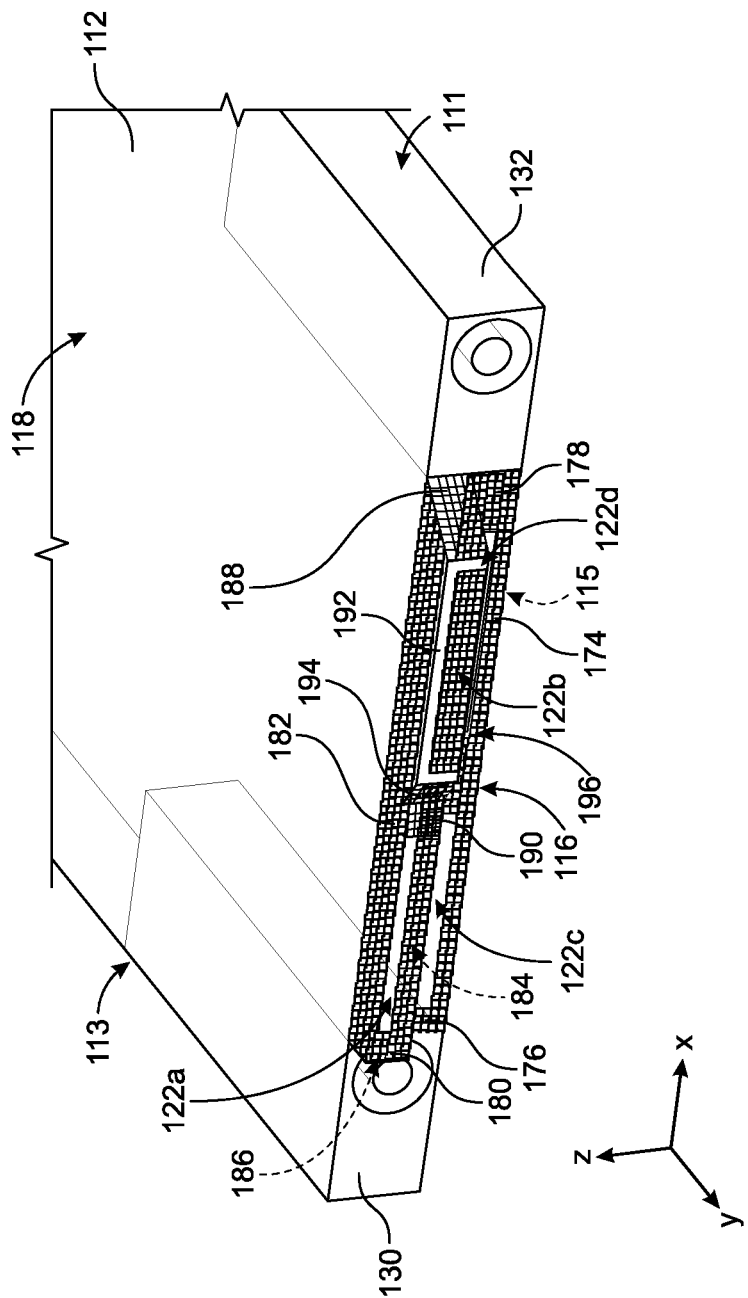
FIG. 5 depicts a perspective view of a stepped venting rear panel of a server chassis, according to some implementations of the present disclosure.

Referring to FIGS. 4-5, an example computing system 100 includes a server chassis 112. The server chassis 112 includes a first side wall 111, a second side wall 113, a top panel 118, a bottom panel 115, a stepped venting front panel 114, and a rear panel 116 (FIG. 5). In some implementations, the computing system 100 includes one or more processors, a baseboard management controller, a power supply unit, one or more system fans, one or more memories, one or more expansion slots, one or more network interfaces, and other components. The computing system 100 may further include a motherboard coupled to and/or positioned on a portion of the bottom panel 115 of the server chassis 112.

The stepped venting front panel 114 of the server chassis 112 includes a base 140 and a protrusion 150. In some implementations, the base 140 includes three component slots (e.g., a first component slot 120a, a second component slot 120b, and a third component slot 120c) at an upper portion (e.g., a first portion) of the base 140. The three component slots 120a, 120b, and 120c may be formed on a base surface 142 of the base 140. In some implementations, the three component slots 120a, 120b, and 120c are configured to receive three corresponding components (e.g., I/O cards, network PCIe cards, graphics cards, sound cards, etc.), although more or fewer component slots are contemplated.

In some implementations, the base 140 includes a first plurality of venting openings (e.g., venting apertures) 144 formed on the base surface 142 surrounding the three component slots 120a, 120b, and 120c. Additionally or alternatively, the protrusion 150 can have additional, stepped surfaces for the front panel 114. These additional stepped surfaces can be utilized for additional venting to increase the number of apertures on the front panel 114.

As shown in FIG. 4, the protrusion 150 extends from a lower portion (e.g., a second portion) of the base 140. In some implementations, the protrusion 150 has a uniform height (e.g., about half of the height of the base 140), width (e.g., about 80% to about 100% of the width of the base 140), and depth (e.g., about 5 mm to about 3 cm). The protrusion 150 includes a top surface 152, a bottom surface 154 opposite the top surface 152, a first side surface 156, a second side surface 158 opposite to the first side surface 156, and a front surface 160 parallel to the base surface 142. In this example, each surface is positioned perpendicular to its adjacent surfaces. In other examples, one or more surfaces may be sloped and/or tapered. In some implementations, the protrusion 150 includes three component slots 120d, 120e, and 120f, which are formed on the front surface 160 of the protrusion 150.

One or more of the additional surfaces (152, 154, 156, 158, 160) of the protrusion 150 may include additional pluralities of venting apertures to provide venting and/or airflow, in addition to the first plurality of venting apertures 144 formed on the base surface 142. For example, in some implementations, the top surface 152 includes a second plurality of venting apertures 162. In some such implementations, the second plurality of venting apertures 162 on the top surface 152 provides additional ventilation and/or airflow in the z direction (e.g., in addition to existing openings on the top panel 118 of the server chassis 112). Alternatively, in some other such implementations, apertures are not needed on the top panel 118 of the server chassis 112 because the second plurality of venting apertures 162 on the top surface 152 can provide adequate airflow in that direction (e.g., in the z direction).

As another example, in some implementations, the second side surface 158 can include a third plurality of venting apertures 168. In some such implementations, the third plurality of venting apertures 168 on the second side surface 158 provides additional ventilation and/or airflow in the x direction (e.g., in addition to existing openings on the side panel 172 of the server chassis 112). Alternatively, in some other implementations, apertures are not needed in the side panel 172 of the server chassis 112, because the third plurality of venting apertures 168 formed on the second side surface 158 can provide adequate airflow in that direction (e.g., in the x direction). Further additionally or alternatively, the front surface 160 can include a fourth plurality of venting openings 170 surrounding the three component slots 120d, 120e, and 120f.

Although FIG. 4 shows one protrusion 150 formed across substantially the entire width W of the lower portion of the base 140, one or more protrusions of different heights, widths, and/or depths can extend from the base 140, to generate more or fewer stepped surfaces. For example, FIG. 5 shows an alternative configuration that can also be implemented on the front panel 114.

The configuration of the stepped venting front panel 114 shown in FIG. 4 may be implemented on the rear panel 116 (FIG. 5). Additionally or alternatively, the rear panel 116 of the server chassis 112 may include a stepped venting configuration as depicted in FIG. 5, where same reference numbers refer to the same or similar elements in FIG. 4. The rear panel 116 may be positioned between to PSUs 130 and 132. The rear panel 116 includes a base 176, and a first protrusion 180 extending from an upper portion of the base 176. In some implementations, the base 176 includes two component slots 122c and 122d at a lower portion of the base 176. The two component slots 122c and 122d may be formed on the base surface 178 of the base 176. In some implementations, the component slots 122c and 122d are configured to receive two corresponding components (e.g., I/O cards), although more or fewer component slots are contemplated.

In some implementations, the base 176 includes a first plurality of venting apertures 174 formed on the base surface 178 surrounding the component slots 122c and 122d. Additionally or alternatively, the first protrusion 180 can generate additional stepped surfaces for the rear panel 116. These additional surfaces can be utilized for additional venting to increase the number of apertures in the rear panel 116. The protrusion 180 includes a top surface 182, a bottom surface 184 opposite the top surface 182, a first side surface 186, a second side surface 188 opposite the first side surface 186, and a front surface 190 parallel to the base surface 178. In some implementations, the first protrusion 180 includes a component slot 122a, which may be formed on the front surface 190 of the first protrusion 180.

Further, additionally or alternatively, to generate even more surfaces, the rear panel 116 includes a second protrusion 192 extending further in depth than the first protrusion 180. The second protrusion 192 shares the top surface 182, the bottom surface 184, and the second side surface 188 with the first protrusion 180. In addition, the second protrusion 192 includes another side surface 194 opposite the second side surface 188, and another front surface 196. In some implementations, the second protrusion 192 includes a component slot 122b formed on the front surface 196 of the second protrusion 192.

As shown in FIG. 5, the side surface 194 and the second side surface 188 is sloped, rather than perpendicular to the another front surface 196. The sloped surfaces allow for additional surface area and additional venting apertures without requiring as much extension, thus preventing further elongating the chassis 112.

One or more of the additional surfaces (182, 184, 186, 188, 190, 194, 196) generated by the first protrusion 180 and the second protrusion 192 may include additional pluralities of venting apertures to provide venting and/or airflow, in addition to the first plurality of venting apertures 174 formed on the base surface 178.

In some implementations, the first protrusion 180 and the second protrusion 192 are integrated. Additionally or alternatively, in some implementations, the first protrusion 180 and/or the second protrusion 192 is integral to the base 176.

Figure 2:
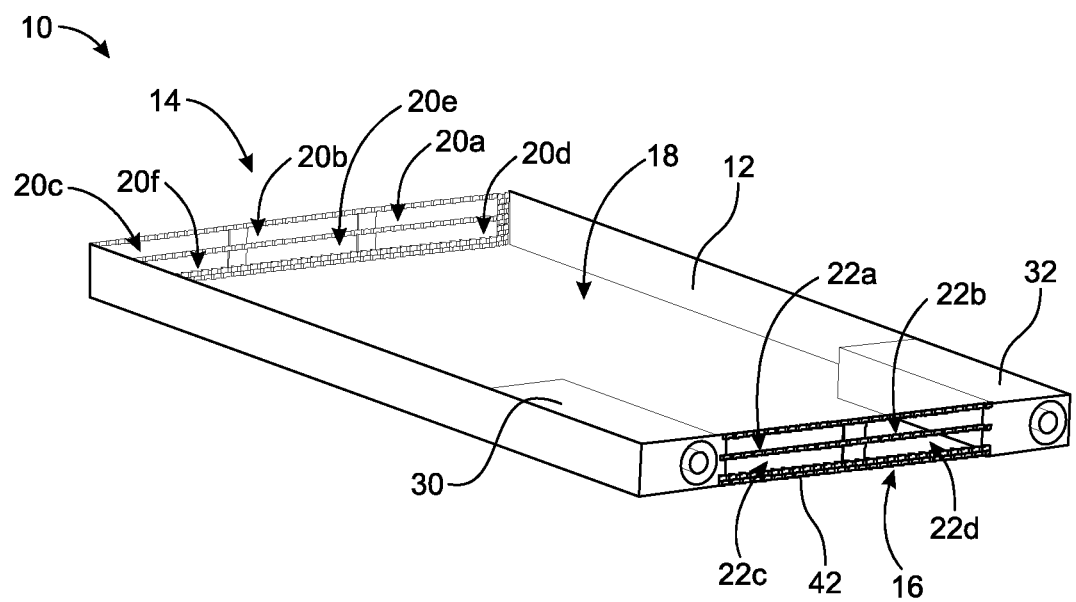
FIG. 2 depicts a perspective view of a rear panel of the conventional server chassis, as known in the prior art.
Figure 3:
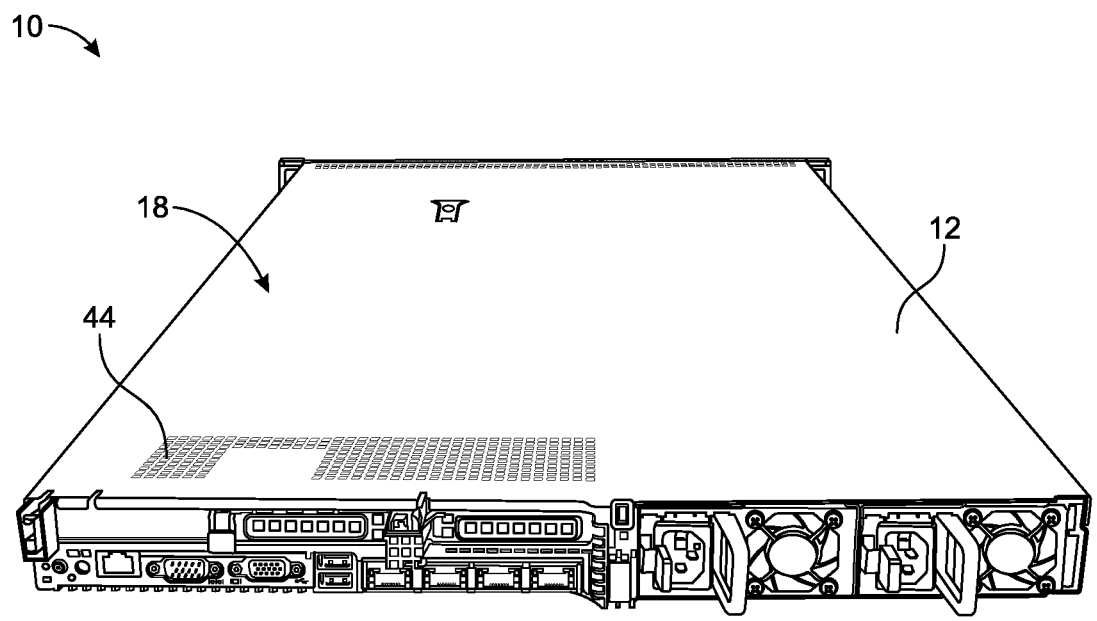
FIG. 3 depicts a perspective view of a top panel of the conventional server chassis, as known in the prior art.

Advantageously, a system having both the stepped venting front panel 114 and stepped venting rear panel 116 in the server chassis 112, has about 30% greater air flow than the conventional server system 10 shown in FIGS. 1-3.

While the example computing system 100 includes a server chassis 112, the above-described stepped arrangement may be built into any computing system having a chassis that requires venting. Such computing systems may include, for example, storage devices, network switches, communications equipment, any type of server, and the like.

One or more elements or aspects or steps, or any portion(s) thereof, from one or more of any of claims 1-20 below can be combined with one or more elements or aspects or steps, or any portion(s) thereof, from one or more of any of the other claims 1-20 or combinations thereof, to form one or more additional implementations and/or claims of the present disclosure.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

Although the disclosed embodiments have been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A system chassis insertable in a rack, the system chassis comprising:
    a first end panel including:
        a first base surface having a first portion and a second portion;
        a first component slot formed on the first portion of the first base surface, the first component slot configured to receive a first card type system component;
        a first plurality of venting apertures formed on the first portion of the first base surface and surrounding the first component slot; and
        a first protrusion extending from the second portion of the first base surface, the first protrusion including a second plurality of venting apertures and a second component slot configured to receive a second card type system component.

2. The system chassis of claim 1, wherein the first protrusion of the first end panel includes a first front surface parallel to the first base surface, and wherein the second component slot is formed on the first front surface of the first protrusion of the first end panel.

3. The system chassis of claim 2, wherein the first protrusion of the first end panel includes a first top surface perpendicular to the first front surface and perpendicular to the first base surface, and wherein the first end panel further includes a third plurality of venting apertures formed on the first top surface of the first protrusion of the first end panel.

4. The system chassis of claim 3, wherein the first protrusion of the first end panel includes a first bottom surface perpendicular to the first front surface and perpendicular to the first base surface, and wherein the first end panel further includes a fourth plurality of venting apertures formed on the first bottom surface of the first end panel.

5. The system chassis of claim 3, wherein the first protrusion of the first end panel includes a first bottom surface sloped from the first base surface to the first front surface, and wherein the first end panel further includes a fourth plurality of venting apertures formed on the first bottom surface of the first end panel.

6. The system chassis of claim 2, wherein the first protrusion of the first end panel includes a first top surface sloped from the first base surface to the first front surface, and wherein the first end panel further includes a third plurality of venting apertures formed on the first top surface of the first protrusion of the first end panel.

7. The system chassis of claim 2, wherein the first end panel further includes a third plurality of venting apertures formed on a first side surface of the first end panel.

8. The system chassis of claim 7, wherein the first side surface of the first end panel is perpendicular to the first front surface and perpendicular to the first base surface.

9. The system chassis of claim 7, wherein the first side surface of the first end panel is sloped from the first base surface to the first front surface of the first protrusion.

10. The system chassis of claim 2, wherein the first end panel further includes:
    a second protrusion extending from the first front surface of the first protrusion, the second protrusion including a third plurality of venting apertures and a third component slot configured to receive a third system component.

11. The system chassis of claim 10, wherein the second protrusion of the first end panel includes a second front surface parallel to the first base surface, and wherein the third component slot is formed on the second front surface of the second protrusion of the first end panel.

12. The system chassis of claim 11, wherein the first end panel includes a second top surface (i) perpendicular to the second front surface of the second protrusion and (ii) perpendicular to the first base surface, and wherein the third plurality of venting apertures is formed on the second top surface of the first end panel.

13. The system chassis of claim 11, wherein the first end panel includes a second side surface perpendicular to the first base surface and perpendicular to the second front surface of the second protrusion.

14. The system chassis of claim 13, wherein the second side surface of the first end panel is sloped from the first base surface to the second front surface of the second protrusion.

15. The system chassis of claim 1 further comprising:
a second end panel opposite to the first end panel, the second end panel including:
a second base surface having a first portion and a second portion;
a third component slot formed on the first portion of the second base surface, the third component slot being configured to receive a third system component;
a third plurality of venting apertures formed on the first portion of the second base surface and surrounding the third component slot; and
a third protrusion extending from the second portion of the second base surface, the third protrusion including a fourth plurality of venting apertures and a fourth component slot configured to receive a fourth system component.

16. The system chassis of claim 15, wherein the third protrusion of the second end panel includes a front surface parallel to the second base surface of the second end panel, and wherein the fourth component slot is formed on the front surface of the third protrusion of the second end panel.

17. The system chassis of claim 16, wherein the third protrusion of the second end panel includes a top surface (i) perpendicular to the front surface of the second end panel and (ii) perpendicular to the second base surface of the second end panel, and wherein the second end panel further includes a fifth plurality of venting apertures formed on the top surface of the third protrusion of the second end panel.

18. The system chassis of claim 16, wherein the second end panel further includes a fifth plurality of venting apertures formed on a side surface of the second end panel, and wherein the side surface of the second end panel is sloped from the second base surface of the second end panel to the front surface of the second end panel.

19. The system chassis of claim 15, wherein the second end panel further includes:
a fourth protrusion extending from the third protrusion, the fourth protrusion including a fifth plurality of venting apertures and a fifth component slot configured to receive a fifth system component.

20. The system chassis of claim 19, wherein the fourth protrusion of the second end panel includes a front surface parallel to the second base surface of the second end panel, and wherein the fifth component slot is formed on the front surface of the fourth protrusion of the second end panel.

21. A system chassis insertable in a rack, the system chassis comprising:
a first end panel including:
a first base surface having a first portion and a second portion;
a first component slot formed on the first portion of the first base surface, the first component slot configured to receive a first system component;
a first plurality of venting apertures formed on the first portion of the first base surface and surrounding the first component slot; and
a first protrusion extending from the second portion of the first base surface, the first protrusion including a second plurality of venting apertures and a second component slot configured to receive a second system component, wherein the first protrusion of the first end panel includes a first front surface parallel to the first base surface, and wherein the second component slot is formed on the first front surface of the first protrusion of the first end panel.

* * * * *